(12) United States Patent
Fenstermaker et al.

(10) Patent No.: US 7,242,634 B2
(45) Date of Patent: Jul. 10, 2007

(54) PSEUDO-DYNAMIC WORD-LINE DRIVER

(75) Inventors: Larry R. Fenstermaker, Nazareth, PA (US); Gregory S. Cartney, Coplay, PA (US)

(73) Assignee: Lattice Semiconductor Corporation, Hillsboro, OR (US)

( * ) Notice: Subject to any disclaimer, the term of this patent is extended or adjusted under 35 U.S.C. 154(b) by 43 days.

(21) Appl. No.: 11/290,205

(22) Filed: Nov. 30, 2005

(65) Prior Publication Data

US 2007/0121415 A1    May 31, 2007

(51) Int. Cl.
*G11C 8/00*   (2006.01)
(52) U.S. Cl. .............................. 365/230.08; 365/230.06
(58) Field of Classification Search ........... 365/230.08, 365/230.06, 230.01
See application file for complete search history.

(56) References Cited

U.S. PATENT DOCUMENTS 5,291,076 A * 3/1994 Bridges et al. ............... 326/52
5,546,024 A * 8/1996 Greenberg .................. 326/106

* cited by examiner

*Primary Examiner*—Vu A. Le
(74) *Attorney, Agent, or Firm*—Steve Mendelsohn

(57) ABSTRACT

In certain embodiments, the present invention is a word-line driver for an address decoder that decodes a multi-bit address to enable access to a row of circuit elements such as memory cells in a block of memory implemented in a dedicated memory device or as part of a larger device, such as an FPGA. The word-line driver has a feed-back latch for each word-line that ensures that the word-line is not energized when that word-line is not selected for access. By controlling the feed-back latch using a decoded address bit value rather than a pre-charged enable signal as do some prior-art dynamic word-line drivers, the word-line driver prevents undesirable energizing of multiple word-lines. The word-line driver can be implemented using less layout area and less power than some analogous prior-art static word-line drivers.

20 Claims, 7 Drawing Sheets

PSEUDO-DYNAMIC WORD-LINE DRIVER

TECHNICAL FIELD

The present invention relates to memory devices, and, in particular, to the word-line drivers for use within such memory devices.

BACKGROUND

In a typical block of memory such as random access memory (RAM), memory cells are arranged in rows and columns, where the memory cells in each row are accessed by energizing a word-line shared by those memory cells, where each different row has its own unique word-line and each word-line has its own unique address in the memory block.

For example, for a block of memory having 64 rows of memory cells and 64 corresponding word-lines, each of the 64 different word-lines would typically have its own unique 6-bit address. A particular row of memory cells is accessed by applying the 6-bit address of the row's corresponding word-line to an address decoder that is connected to all 64 word-lines. The address decoder decodes (i.e., interprets) the 6-bit address and energizes the corresponding word-line to access the particular row of memory cells. In a typical memory block, no more than one word-line is allowed to be energized at a time.

FIG. 1 shows a block diagram of a conventional address decoder 100 for decoding a 6-bit word-line address (A5 A4 A3 A2 A1 A0) to energize one of 64 word-lines WL<63:0> in a block of memory. Address decoder 100 has three 2-bit decoders 102-1, 102-2, and 102-3 and sixteen word-line drivers 104-1 to 104-16, only two of which are shown in FIG. 1.

Two-bit decoder 102-1 receives (least-significant) address bits A0 and A1 and generates four decoded bit values DEC0–DEC3, which are applied to the D3–D0 inputs of each of the 16 word-line drivers 104. The following logic table shows the decoding processing implemented by 2-bit decoder 102-1.

| TWO-BIT DECODER LOGIC | | | | | |
|---|---|---|---|---|---|
| A1 | A0 | DEC3 | DEC2 | DEC1 | DEC0 |
| 0 | 0 | 0 | 0 | 0 | 1 |
| 0 | 1 | 0 | 0 | 1 | 0 |
| 1 | 0 | 0 | 1 | 0 | 0 |
| 1 | 1 | 1 | 0 | 0 | 0 |

Two-bit decoder 102-2 receives address bits A2 and A3 and generates four decoded bit values DEC4–DEC7. Similarly, two-bit decoder 102-3 receives (most-significant) address bits A4 and A5 and generates four decoded bit values DEC11–DEC8. Two-bit decoders 102-2 and 102-3 implement logic similar to that of 2-bit decoder 102-1.

In addition to receiving decoded bit values DEC0–DEC3, each word-line driver 104 receives enable signal ENABLE (at its EN input) and a unique combination of one of decoded bit values DEC4–DEC7 (at its D74 input) and one of decoded bit values DEC8–DEC11 (at its D118 input) and uses those input signals to control four word-line drive signals WL for a different set of four word-lines in the 64-word-line memory block. As shown in FIG. 1, word-line driver 104-1 receives the two-bit combination of decoded bit values DEC8 and DEC4 and generates four word-line drive signals WL<3:0> that are applied to the first set of four word-lines in the memory block. Similarly, word-line driver 104-16 receives the two-bit combination of decoded bit values DEC11 and DEC7 and generates four word-line drive signals WL<63:60> that are applied to the last set of four word-lines in the memory block. The 14 other two-bit combinations of DEC7–DEC4 and DEC11–DEC 8 are input to the other 14 word-line drivers 104 (not shown in FIG. 1) to generate the remaining word-line drive signals WL<59:4> for the remaining 56 word-lines in the memory block.

For each possible 6-bit address, only one of the 16 unique two-bit combinations applied to the 16 different word-line drivers 104 will have a value of (11). The particular word-line driver 104 that receives this combination at its D118 and D74 inputs will energize one of its four word-line drive signals WL (as determined by the four decoded bit values DEC3–DEC0). Each of the other 15 word-line drivers 104 will receive a different two-bit combination (i.e., (10), (01), or (00)) at its D118 and D74 inputs and will therefore not energize any of its four word-line drive signals WL.

A word-line driver 104 is not able to energize any of its word-line drive signals WL if the ENABLE signal is low. The ENABLE signal is typically controlled such that it is driven high only after the rest of the processing in address decoder 100 has settled, in order to prevent more than one word-line drive signal WL from being energized at the same time.

FIG. 2 shows a schematic diagram of a portion of a prior-art static four-line word-line driver 200, which may be used to implement each word-line driver 104 in FIG. 1. Word-line driver 200 controls four word-line drive signals WL0–WL3 based upon input signals D118, D74, D0–D3, and EN. FIG. 2 shows the circuitry used to control only the first two of the four word-line drive signals WL0 and WL1, which circuitry relies on input signals D0 and D1. Word-line driver 200 also has an analogous set of circuitry that relies on input signals D2 and D3 (in place of input signals D0 and D1) to control word-line drive signals WL2 and WL3. Note that both sets of circuitry share NFETs 210 and 204.

Referring to FIG. 2, if input signals D118 and D74 are both high (i.e., logical 1), then PFETs 202 and 208 are off, and NFETs 204 and 210 are on, which drives node W low (i.e., logical 0). If input signal D0 is also high, then PFET 220 is off, and NFET 218 is on, which allows node W to drive node W0 (at the input of inverter 222) low and therefore the output of inverter 222 high. If input signal EN is also high, then word-line drive signal WL0 at the output of AND gate 226 will also be high, thereby energizing the corresponding word-line.

Alternatively, if input signals D118, D74, and D1 are all high, then PFETs 202, 208, and 216 are off, and NFETs 204, 210, and 214 are on, which drives node W and node W1 (at the input of inverter 224) low and therefore the output of inverter 222 high. If input signal EN is also high, then word-line drive signal WL1 at the output of AND gate 228 will also be high, thereby energizing the corresponding word-line.

FIG. 3 illustrates a pair of signal-timing diagrams 302 and 304 for word-line driver 200 of FIG. 2. Timing diagram 302 corresponds to the selection of word-line drive signal WL0, while timing diagram 304 corresponds to the selection of word-line signal WL1.

At time T0, input signals D118, D74, D1, D0, and EN are all low. According to the circuitry of FIG. 2 and as shown in FIG. 3, at time T0, nodes W, W0, and W1 will be high, and nodes WL0 and WL1 will be low.

At time T1, input signals D118, D74, and D0 go high (e.g., as a result of an appropriate 6-bit address value being applied to the three 2-bit decoders 102 of FIG. 1), while input signals D1 and EN remain low. As a result, the circuitry of word-line driver 200 drives node W low, followed by node W0 being driven low.

At time T2, input signal EN goes high. As a result, the circuitry of word-line driver 200 drives node WL0 high, thereby energizing the corresponding word-line.

Similarly, in timing diagram 304, at time T3, input signals D118, D74, D1, D0, and EN are again all low, and again nodes W, W0, and W1 will be high, and nodes WL0 and WL1 will be low.

At time T4, input signals D118, D74, and D1 go high, while input signals D0 and EN remain low. As a result, the circuitry of word-line driver 200 drives node W low, followed by node W1 being driven low.

At time T5, input signal EN goes high. As a result, the circuitry of word-line driver 200 drives node WL1 high, thereby energizing the corresponding word-line.

Similar timing diagrams could be drawn showing the analogous signal levels associated with selectively driving one of word-lines WL2 and WL3 high using the other half of the circuitry of word-line driver 200 that is not shown in FIG. 2.

As indicated in FIG. 3, the assertion of the enable signal is delayed relative to the assertion of the address bits (e.g., which may be said to occur at times T0 and T3) to give time for the rest of the processing of the address decoder (i.e., the decoding of the address bits in the different 2-bit decoders (e.g., from time T0 to T1) as well as the processing of the resulting decoded bit values within the word-line driver (e.g., from time T1 to T2)) to settle. Note that the timing diagram in FIG. 3 began with all decoded addresses (D118, D74, D1, and D0) low, but any combination of these signals could begin high. If the enable signal were asserted too early, then an undesirable condition could exist where two or more word-lines are energized at the same time.

As shown in FIG. 2, word-line driver 200 has a PFET transistor associated with each decoded-bit input value in each word-line, where the PFETs are used to pull nodes W0 and W1 high if at least one of the corresponding decoded-bit input values is low. For example, at least one of PFETs 202, 208, and 222, associated with word-line WL0, will be on if at least one of decoded-bit input values D118, D74, and D0 is low. Thus, for all four word-lines, word-line driver 200 will have a total of 12 PFETs associated with its six decoded-bit input values (i.e., D0–D3, D74, and D118). Such a static word-line driver occupies a significant amount of layout area and consumes a significant amount of power.

FIG. 4 shows a schematic diagram of a portion of a prior-art dynamic four-line word-line driver 400, which, like static word-line driver 200 of FIG. 2, may be used to implement each word-line driver 104 in FIG. 1. Like word-line driver 200, word-line driver 400 controls four word-line drive signals WL0–WL3 based upon input signals D118, D74, D0–D3, and EN. Like FIG. 2, FIG. 4 shows the circuitry used to control only the first two of the four word-line drive signals WL0 and WL1, which circuitry relies on input signals D0 and D1. Word-line driver 400 also has an analogous set of circuitry that relies on input signals D2 and D3 (in place of input signals D0 and D1) to control word-line drive signals WL2 and WL3. Note that both sets of circuitry share NFETs 402, 404, and 406.

Referring to FIG. 4, if input signals EN, D118, and D74 are all high, then NFETs 402, 404, and 406 are on, which drives node W low. If input signal D0 is also high, then NFET 410 is on, which allows node W to drive node W0 low and therefore node WL0 (at the output of inverter 416) high, thereby energizing the corresponding word-line. Inverter 416 and PFETs 412 and 414 form a feed-back latch that drives node WL0 low if input signal EN goes low.

Alternatively, if input signal D1 is high (instead of input signal D0), then NFET 408 is on, which allows node W to drive node W1 low and therefore node WL1 (at the output of inverter 422) high, thereby energizing the corresponding word-line. Inverter 422 and PFETs 418 and 420 form a feed-back latch that drives node WL1 low if input signal EN goes low.

FIG. 5 illustrates a pair of signal-timing diagrams 502 and 504 for word-line driver 400 of FIG. 4. Timing diagram 502 corresponds to the selection of word-line drive signal WL0, while timing diagram 504 corresponds to the selection of word-line signal WL1.

At time T0, input signals D118, D74, D1, D0, and EN are all low. According to the circuitry of FIG. 4 and as shown in FIG. 5, at time T0, the value at node W will be indefinite (as a node floating between deactivated NFETs), nodes W0 and W1 will be high (as a result of the EN signal turning on PFETs 412 and 418), and nodes WL0 and WL1 will be low.

At time T1, input signals D118, D74, and D0 go high, while input signals D1 and EN remain low, which causes the circuitry of word-line driver 400 to drive node W high (i.e., via PFET 412 and NFET 410).

At time T2, input signal EN goes high, which causes the circuitry of word-line driver 400 to drive node W low (via NFETs 402, 404, and 406) and node W0 low (via NFET 410), which in turn drives node WL0 high (via inverter 416), thereby energizing the corresponding word-line.

Similarly, in timing diagram 504, at time T3, input signals D118, D74, D1, D0, and EN are again all low, and again the value at node W will be indefinite, nodes W0 and W1 will be high, and nodes WL0 and WL1 will be low.

At time T4, input signals D118, D74, and D1 go high, while input signals D0 and EN remain low, which causes the circuitry of word-line driver 400 to drive node W high (i.e., via PFET 22 and NFET 408).

At time T5, input signal EN goes high, which causes the circuitry of word-line driver 400 to drive node W low (via NFETs 402, 404, and 406) and node W1 low (via NFET 408), which in turn drives node WL1 high (via inverter 422), thereby energizing the corresponding word-line.

One of the advantages of dynamic word-line driver 400 over static word-line driver 200 of FIG. 2 is that word-line driver 400 does not have any PFETs associated with any of its decoded-bit input values. Rather, for each word-line WLi, word-line driver 400 has a latch driven by input signal EN, which functions as a pre-charge signal to drive the corresponding node Wi high if input signal EN is in its low pre-charge state.

One of the disadvantages of word-line driver 400 is the possibility of inadvertently driving two (or more) word-lines at the same time. As described previously, under ideal (e.g., noise-free and with sufficient timing margin) circumstances, at most, only one of input signals D0 and D1 will be high at any time.

For example, as shown in timing diagram 302 of FIG. 3, if input signals D118, D74, and D0 are all high, while input signal D1 is low, then asserting input signal EN at time T2 will drive node WL0 high, while node WL1 stays low. Driving input signal EN high also turns off the latches associated with both nodes WL0 and WL1. As a result, nothing in word-line driver 400 is left to ensure that WL1 will stay low. If, for example, a temporary noise glitch occurs in input signal D1 or if D1 is originally high and does not go low before EN goes high, causing a temporary overlap of high decoded addresses, then NFET 408 could turn on, which would enable node W to drive node W1 low, which in turn would drive node WL1 high, thereby resulting in the undesirable situation in which word-lines WL0 and WL1 are simultaneously energized. After the temporary noise glitch disappears from input signal D1 or when D1 goes low from decoding and NFET 408 turns back off, node W1 will be a floating node that could stay low and thereby undesirably keep word-line WL1 energized.

SUMMARY

In a first embodiment, the present invention is an integrated circuit having a word-line driver adapted to receive a set of decoded bits and control a set of word-lines. The word-line driver comprises first and second sets of circuitry. The first set of circuitry receives and processes a first subset of one or more decoded bits and is connected to a first node in the word-line driver. The second set of circuitry is connected to the first node and receives and processes a second subset of decoded bits to control the set of word-lines. For each word-line, the second set of circuitry comprises a corresponding feed-back latch controlled by a corresponding decoded bit and drives the corresponding word-line low if the corresponding decoded bit indicates that the corresponding word-line is not selected.

In a second embodiment, the present invention is an address decoder comprising one or more bit decoders and one or more word-line drivers. Each bit decoder converts one or more address bits into two or more decoded bits. Each word-line driver receives a set of decoded bits and controls a set of word-lines. Each word-line driver is an instance of the word-line driver of the first embodiment.

In another embodiment, the present invention is an integrated circuit having a memory device comprising a block of memory cells arranged in rows and an address decoder. The address decoder is an instance of the address decoder of the second embodiment.

BRIEF DESCRIPTION OF THE DRAWINGS

Other aspects, features, and advantages of the present invention will become more fully apparent from the following detailed description, the appended claims, and the accompanying drawings in which like reference numerals identify similar or identical elements.

DETAILED DESCRIPTION

Figure 1:
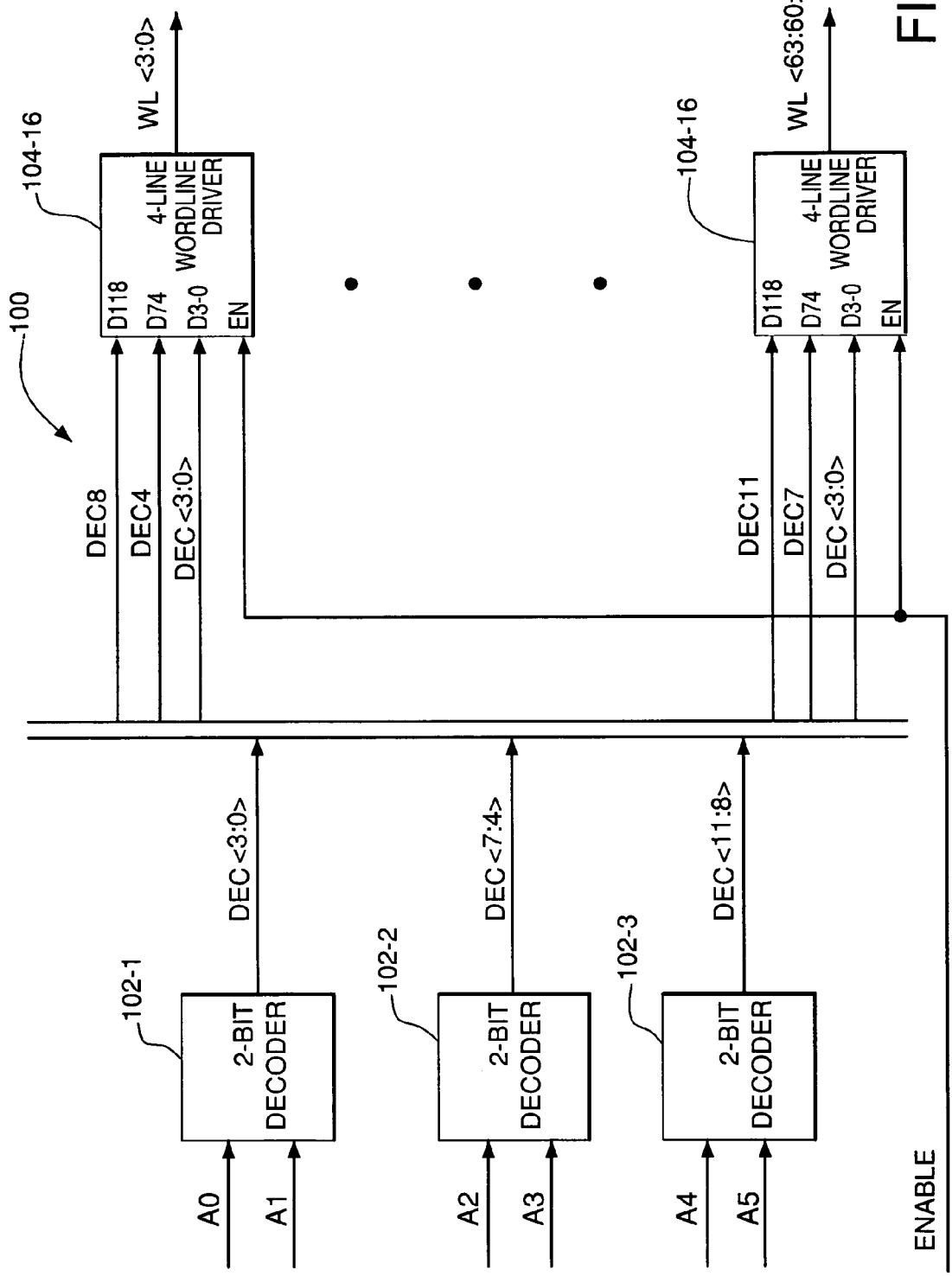
FIG. 1 illustrates an address decoder for decoding a 6-bit address to energize one of 64 word-lines in a block of memory.
Figure 2:
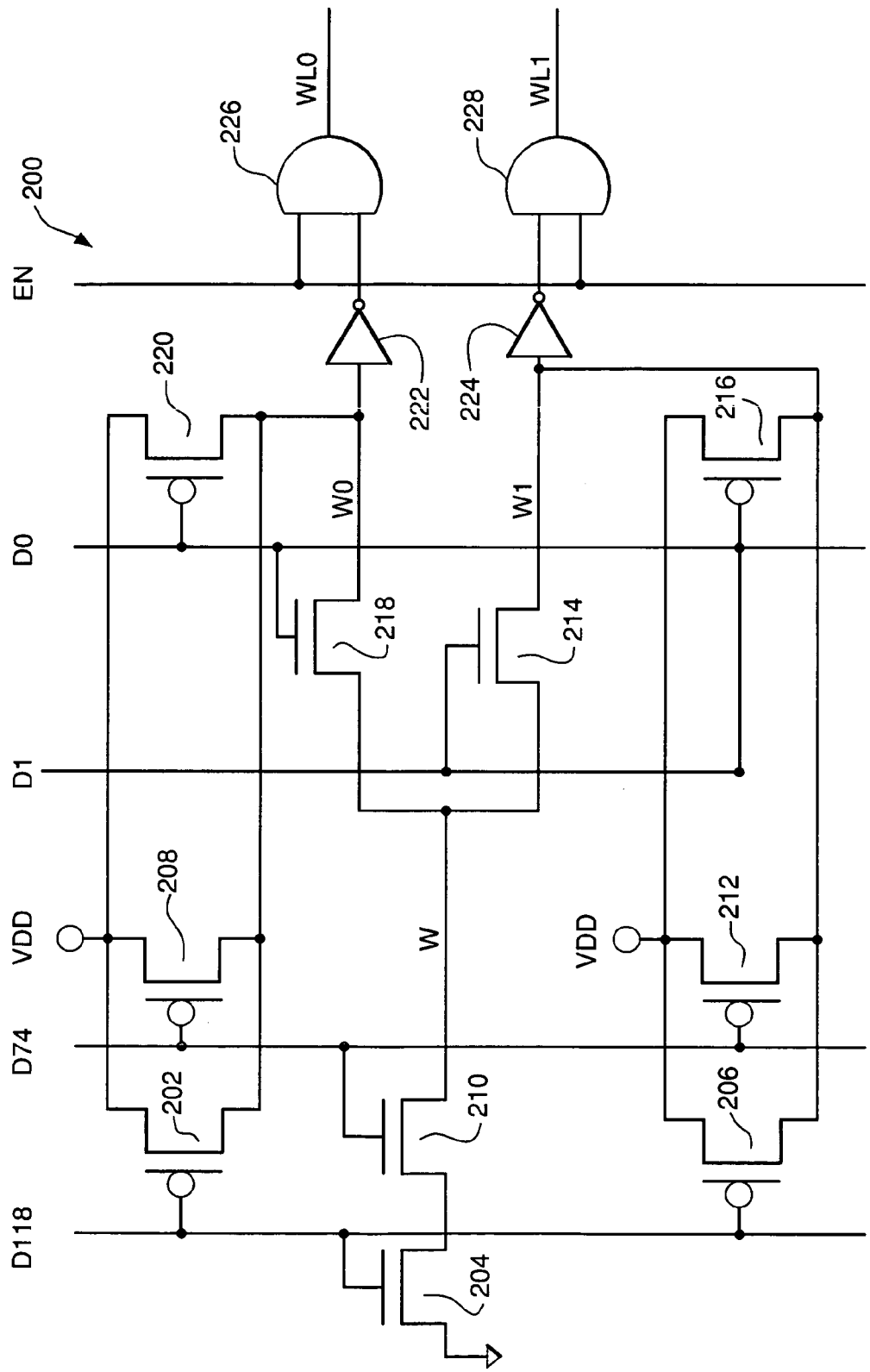
FIG. 2 illustrates a prior-art static word-line driver that may be used to implement each word-line driver in FIG. 1.
Figure 4:
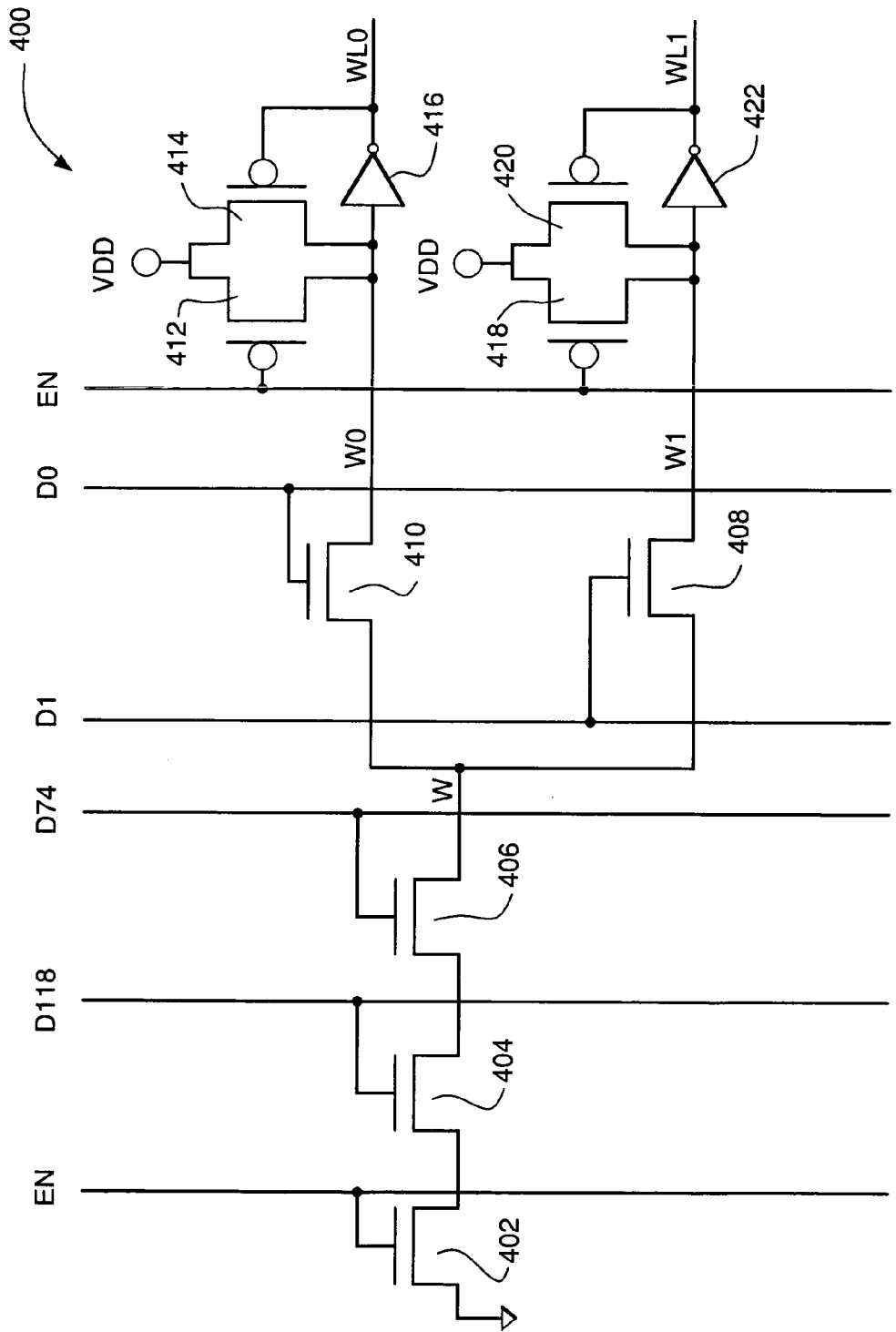
FIG. 4 illustrates a prior-art dynamic word-line driver circuit that may be used to implement each word-line driver in FIG. 1.
Figure 5:
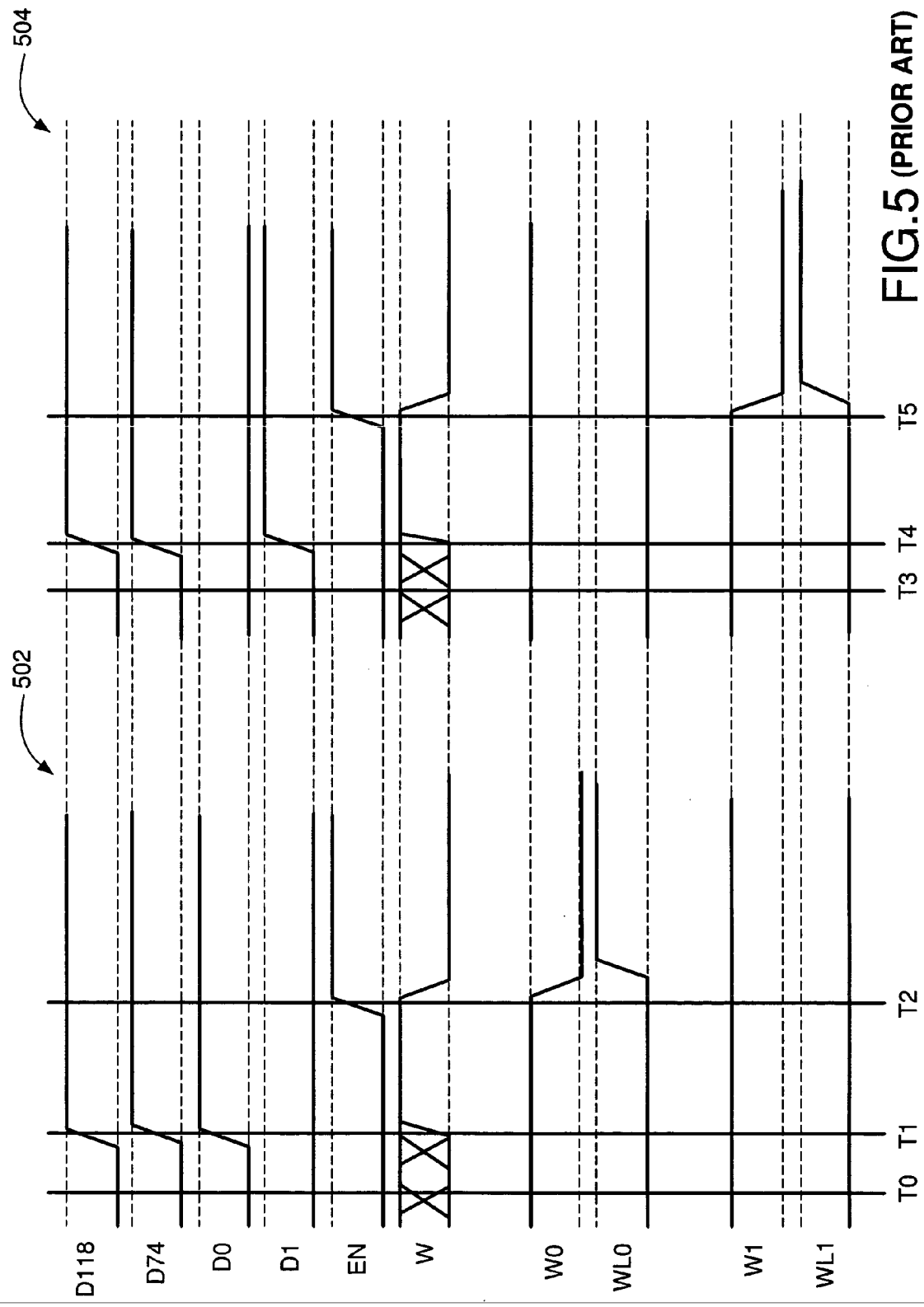
FIG. 5 illustrates signal-timing diagrams associated with FIG. 4.

Prior embodiments of embedded memory addressing functions typically use address decoders similar to address decoder 100 of FIG. 1 implemented using word-line drivers similar to static word-line driver 200 of FIG. 2 or dynamic word-line driver 400 of FIG. 4 to energize word-lines associated with rows of circuit blocks or rows of memory to provide access to those rows.

Figure 6:
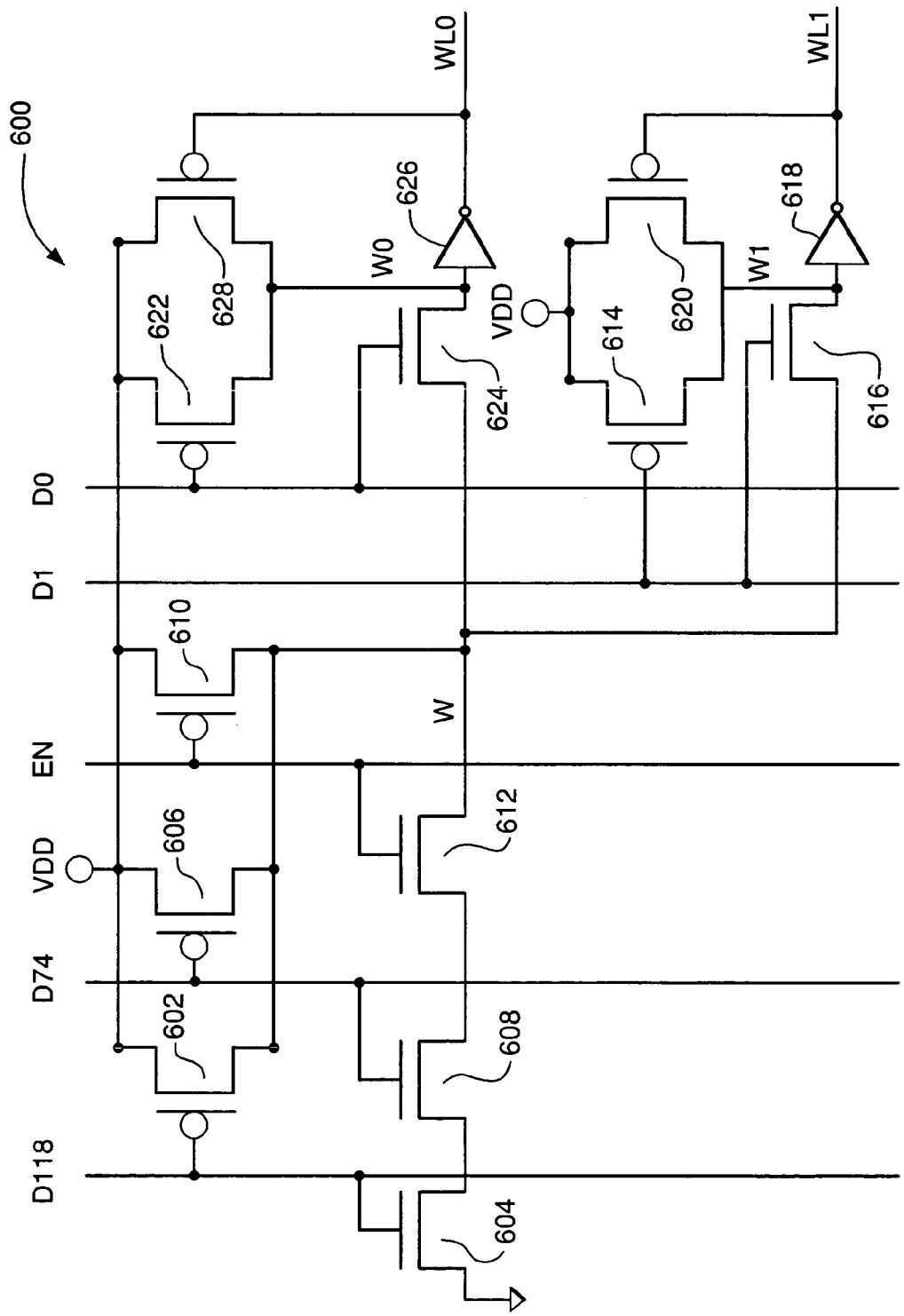
FIG. 6 illustrates a pseudo-dynamic word-line driver circuit according to one possible embodiment of the present invention, which may be used to implement each word-line driver in FIG. 1.

FIG. 6 shows a schematic diagram of a portion of a pseudo-dynamic four-line word-line driver 600, according to one possible embodiment of the present invention. Like word-line drivers 200 and 400 of FIGS. 2 and 4, word-line driver 600 can be used to implement each word-line driver 104 of FIG. 1. Like word-line drivers 200 and 400, word-line driver 600 controls four word-line drive signals WL0–WL3 based upon input signals D118, D74, D0–D3, and EN. Furthermore, like FIGS. 2 and 4, FIG. 6 shows the circuitry used to control only the first two of the four word-line drive signals WL0 and WL1, which circuitry relies on input signals D0 and D1. Word-line driver 600 also has an analogous set of circuitry that relies on input signals D2 and D3 (in place of input signals D0 and D1) to control word-line drive signals WL2 and WL3. Note that both sets of circuitry share NFETs 604, 608, and 612 as well as PFETs 602, 606, and 610.

Referring to FIG. 6, if input signals D118, D74, and EN are all high, then PFETs 602, 606, and 610 are off, and NFETs 604, 608, and 612 are on, which drives node W low. If input signal D0 is also high, then PFET 622 is off, and NFET 624 is on, which allows node W to drive node W0 low and therefore node WL0 (at the output of inverter 626) high, thereby energizing the corresponding word-line. Inverter 626 and PFETs 622 and 628 form a feed-back latch that drives node WL0 low if input signal D0 is low.

Alternatively, if input signal D1 is high (instead of input signal D0), then PFET 614 is off, and NFET 616 is on, which allows node W to drive node W1 low and therefore node WL1 (at the output of inverter 618) high, thereby energizing the corresponding word-line. Inverter 618 and PFETs 614 and 620 form a feed-back latch that drives node WL1 low if input signal D1 is low.

Figure 7:
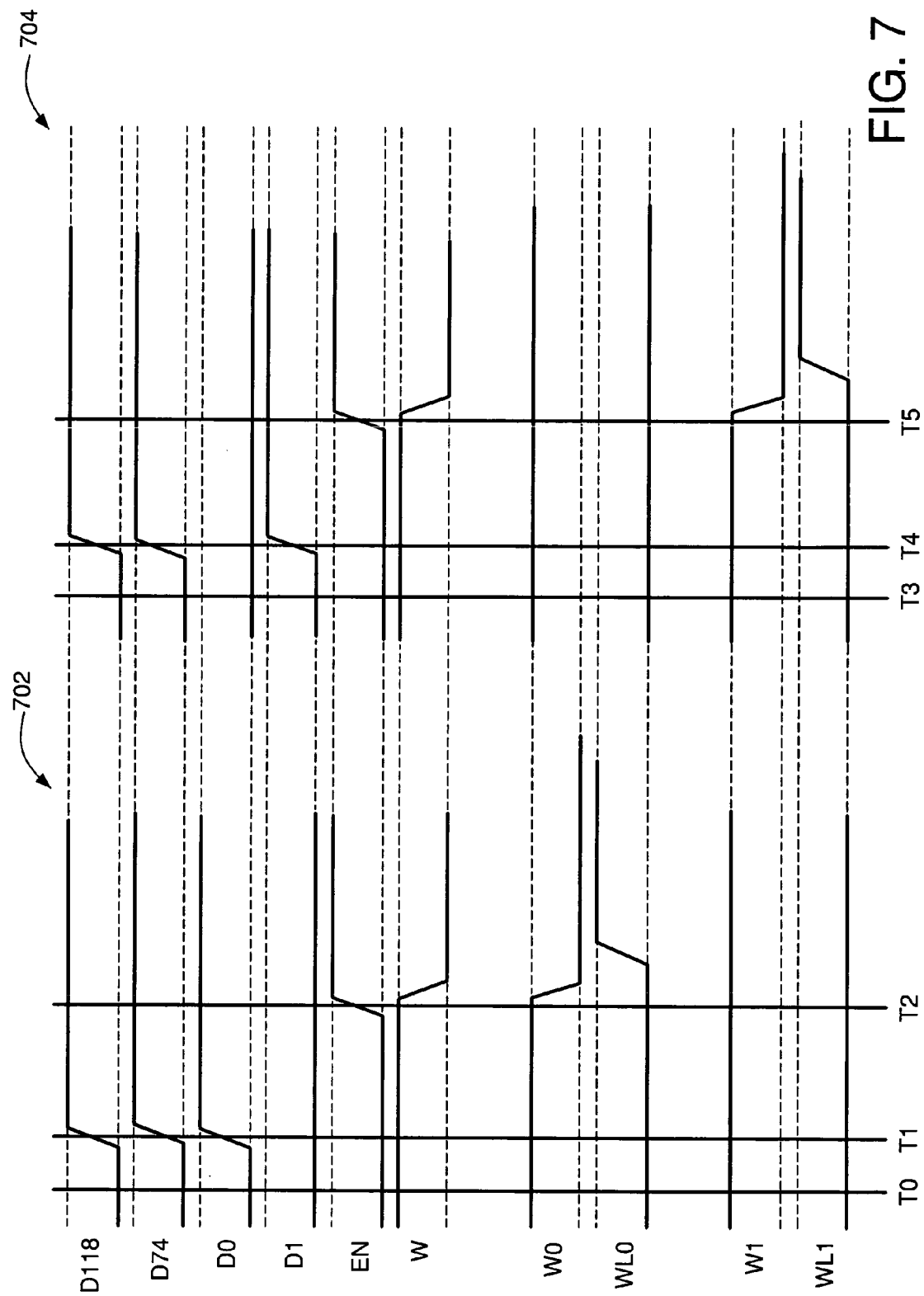
FIG. 7 illustrates signal-timing diagrams associated with FIG. 6.

FIG. 7 illustrates a pair of signal-timing diagrams 702 and 704 for word-line driver 600 of FIG. 6. Timing diagram 702 corresponds to the selection of word-line drive signal WL0, while timing diagram 704 corresponds to the selection of word-line signal WL1.

At time T0, input signals D118, D74, D1, D0, and EN are all low. According to the circuitry of FIG. 6 and as shown in FIG. 7, at time T0, node W will be high (as a result of D118, D74, and EN turning on PFETs 602, 606, and 610), nodes W0 and W1 will be high (as a result of D0 and D1 turning on PFETs 622 and 614), and nodes WL0 and WL1 will be low (as a result of inverters 626 and 618 inverting the levels at nodes W0 and W1).

At time T1, input signals D118, D74, and D0 go high, while input signals D1 and EN remain low. Since NFET 612 remains off and PFET 610 remains on, node W stays high, as shown in FIG. 7. As such, even though D0 going high turns PFET 622 off, D0 also turns NFET 624 on, which allows node W to drive node W0 to stay high, as also shown in FIG. 7.

At time T2, input signal EN goes high, which causes the circuitry of word-line driver 600 to drive node W low (via NFETs 604, 608, and 612), which in turn drives node W0 low (via NFET 624), which in turn drives node WL0 high (via inverter 626), thereby energizing the corresponding word-line.

Similarly, in timing diagram 504, at time T3, input signals D118, D74, D1, D0, and EN are again all low, and again nodes W, W0, and W1 will be high, and nodes WL0 and WL1 will be low.

At time T4, input signals D118, D74, and D1 go high, while input signals D0 and EN remain low. Since NFET 612 remains off and PFET 610 remains on, node W stays high, as shown in FIG. 7. As such, even though D1 going high turns PFET 614 off, D1 also turns NFET 616 on, which allows node W to drive node W1 to stay high, as also shown in FIG. 7.

At time T5, input signal EN goes high, which causes the circuitry of word-line driver 600 to drive node W low (via NFETs 604, 608, and 612), which in turn drives node W1 low (via NFET 616), which in turn drives node WL1 high (via inverter 618), thereby energizing the corresponding word-line.

Word-line driver 600 has a single PFET for each of its decoded-bit input values. Thus, for all four word-lines, word-line driver 200 will have a total of 6 PFETs associated with its six decoded-bit input values (i.e., D0–D3, D74, and D118). This is half as many PFETs as prior-art static word-line driver 200 of FIG. 2.

Unlike dynamic word-line driver 400 of FIG. 4, in which each feed-back latch associated with each word-line is controlled by input signal EN, in word-line driver 600, each feed-back latch is controlled by a different one of decoded-bit input signals D0–D3. This configuration helps prevent two or more word-lines from being energized at the same time.

Figure 3:
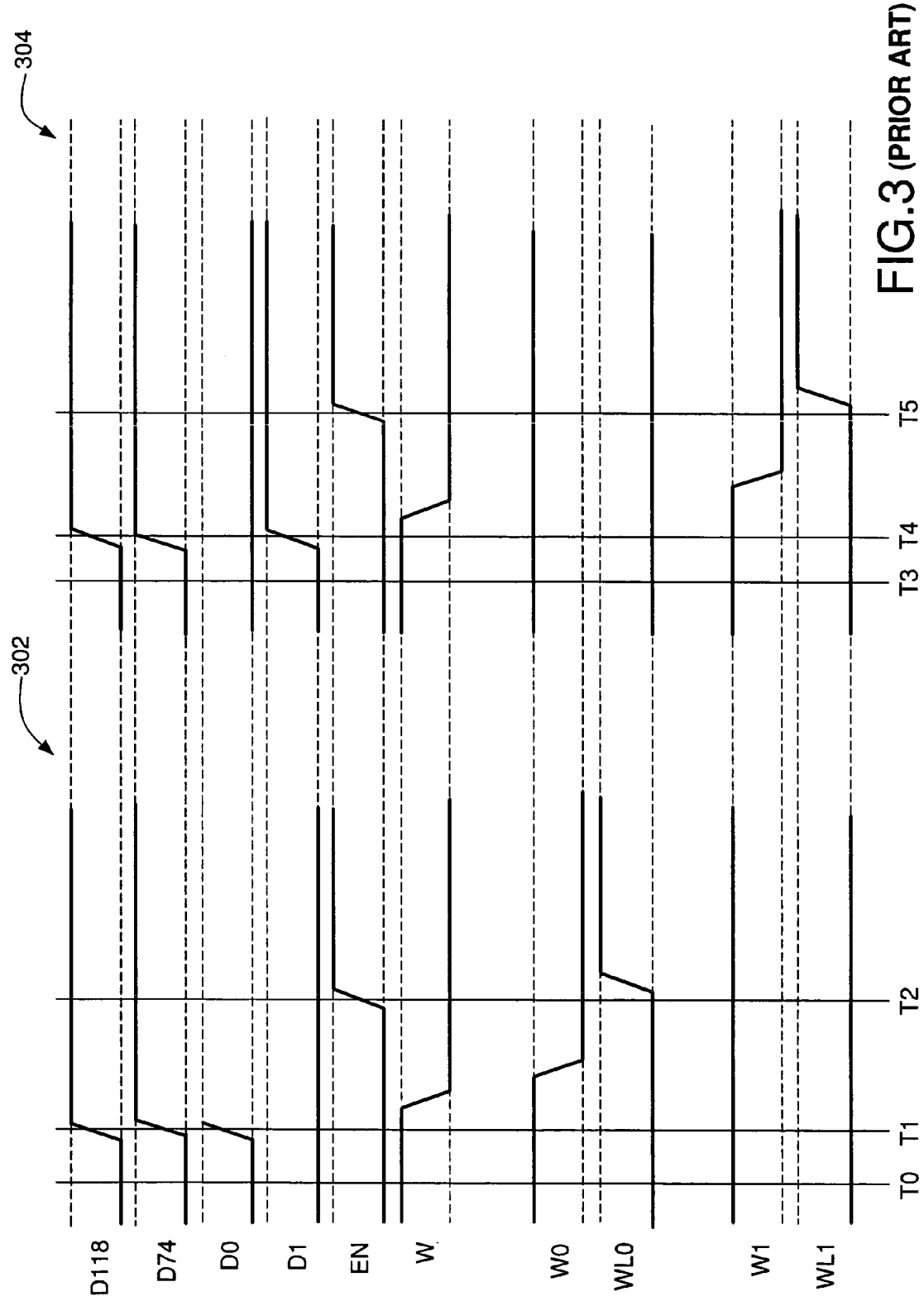
FIG. 3 illustrates signal-timing diagrams associated with FIG. 2.

Take, for example, the same situation described previously for word-line driver 400, in which input signals D118, D74, and D0 are all high, while input signal D1 is low. As shown in timing diagram 702 of FIG. 3, asserting input signal EN at time T2 will drive node WL0 high, while node WL1 stays low. Note that, in word-line driver 600, none of the latches are controlled by input signal EN. As such, driving input signal EN high does not disable any latches.

If a temporary noise glitch occurs in input signal D1 or if D1 begins high and does not go low before EN goes high, causing a temporary overlap of high decoded addresses, then PFET 614 could temporarily turn off and NFET 408 could temporarily turn on, which would enable node W to start to drive node W1 low. However, if the duration of the noise glitch or decoding overlap delay is short compared to the processing delays associated with NFET 616, inverter 618, and PFET 620, then, before node WL1 has a chance to be driven high, NFET 616 will turn back off and PFET 614 will turn back on, thereby ensuring that node W1 never gets low enough for long enough to drive node WL1 high. As such, unlike the analogous situation in word-line driver 400 of FIG. 4, the temporary noise glitch or decoder timing delay in input signal D1 for word-line driver 600 will not result in word-lines WL0 and WL1 being energized and remaining energized at the same time.

Thus, word-line driver 600 of the present invention provides area and power advantages over prior-art static word-line drivers, such as word-line driver 200 of FIG. 2, while preventing more than one word-line from being energized at the same time, unlike prior-art dynamic word-line drivers, such as word-line driver 400 of FIG. 4.

Although the present invention has been described in the context of an address decoder for a memory block having 64 different rows of memory in which each pair of bits in the corresponding six-bit word-line address is decoded by a separate two-bit decoder and each set of four word lines is controlled by a different word-line driver, the invention is not so limited. In general, the invention can be implemented in the context of other configuration memory blocks, including those having:

Other numbers of rows in the memory block and correspondingly other numbers of bits in the word-line address;

Bit decoders that decode other than two bits at a time; and

Word-line drivers that control other than sets of four word lines.

Furthermore, the specific circuitry shown in FIG. 6 may be viewed as exemplary of different possible circuit configurations that achieve analogous results.

For example, instead of generating decoded bit values DEC0–DEC3 that are either (i) reset to all 0s or (ii) enabled to three 0s and one 1, address decoder circuitry could be implemented such that the decoded bit values are either (i) reset to all 1 s or (ii) enabled to three 1s and one 0.

Although the present invention has been described in the context of a word-line driver that receives a distinct enable signal in addition to the decoded bit values, the present invention can also be implemented in the context of word-line drivers that do not receive a distinct enable signal, as described in co-owned and co-pending U.S. patent application Ser. No. 11/252,094, filed on Oct. 17, 2005, the teachings of which are incorporated herein by reference.

Although the present invention has been described in the context of circuitry implemented using n-type and p-type field-effect transistors (NFETs and PFETs), the present invention can also be implemented using other types of integrated circuit devices, including bipolar device and other types of metal-oxide semiconductor (MOS) devices.

The present invention can be implemented for any circuitry having blocks of memory, including dedicated memory devices as well as circuits having embedded memory, e.g., application-specific integrated circuits (ASICs) and programmable devices such as field-programmable gate arrays (FPGAs), programmable logic devices (PLDs), mask-programmable gate arrays (MPGAs), simple programmable logic device (SPLDs), and complex programmable logic devices (CPLDs).

The memory blocks may comprise any suitable type of memory cell, including, but not limited to, static random access memory (SRAM) cells, dynamic RAM (DRAM) cells, virtual DRAM cells, and single transistor cells. Moreover, the memory cells could have any number of ports, such as single-port memory cells, dual-port memory cells, register files, FIFOs, or multi-port memories.

It will be further understood that various changes in the details, materials, and arrangements of the parts which have been described and illustrated in order to explain the nature of this invention may be made by those skilled in the art without departing from the scope of the invention as expressed in the following claims.

Although the elements in the following method claims, if any, are recited in a particular sequence with corresponding labeling, unless the claim recitations otherwise imply a particular sequence for implementing some or all of those elements, those elements are not necessarily intended to be limited to being implemented in that particular sequence.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments necessarily mutually exclusive of other embodiments. The same applies to the term "implementation."

The use of figure numbers and/or figure reference labels in the claims is intended to identify one or more possible embodiments of the claimed subject matter in order to facilitate the interpretation of the claims. Such use is not to be construed as necessarily limiting the scope of those claims to the embodiments shown in the corresponding figures.

We claim:

1. An integrated circuit having a word-line driver adapted to receive a set of decoded bits (e.g., D0, D1, D74, D118) and control a set of word-lines (e.g., WL0, WL1), the word-line driver comprising:
   a first set of circuitry (e.g., 602–608) adapted to receive and process a first subset of one or more decoded bits (e.g., D74, D118) and connected to a first node (e.g., W) in the word-line driver; and
   a second set of circuitry (e.g., 614–628) connected to the first node and adapted to receive and process a second subset of decoded bits (e.g., D0, D1) to control the set of word-lines, wherein, for each word-line (e.g., WL0), the second set of circuitry comprises a corresponding feed-back latch (e.g., 622, 626, 628) controlled by a corresponding decoded bit (e.g., D0) and adapted to drive the corresponding word-line low if the corresponding decoded bit indicates that the corresponding word-line is not selected.

2. The invention of claim 1, wherein the first set of circuitry is shared by all of the word-lines in the set.

3. The invention of claim 1, wherein the first set of circuitry comprises, for each decoded bit (e.g., D74) in the first subset:
   a p-type transistor (e.g., 606) having its gate connected to receive the corresponding decoded bit and its channel connected between a high reference voltage (e.g., VDD) and the first node; and
   an n-type transistor (e.g., 608) having its gate connected to receive the corresponding decoded bit and its channel connected between a low reference voltage (e.g., ground) and the first node.

4. The invention of claim 3, wherein:
   the first subset of decoded bits comprises at least two decoded bits (e.g., D74, D118);
   the channels of the at least two p-type transistors (e.g., 602, 606) associated with the decoded bits in the first subset are connected in parallel between the high reference voltage and the first node; and
   the channels of the at least two n-type transistors (e.g., 604, 608) associated with the decoded bits in the first subset are connected in series between the low reference voltage and the first node.

5. The invention of claim 4, wherein the first set of circuitry further comprises:
   another p-type transistor (e.g., 610) having its gate connected to receive an enable signal (e.g., EN) and having its channel connected in parallel with the channels of the at least two p-type transistors; and
   another n-type transistor (e.g., 612) having its gate connected to receive the enable signal and having its channel connected in series with the channels of the at least two n-type transistors.

6. The invention of claim 1, wherein the second set of circuitry comprises, for each decoded bit (e.g., D0) in the second subset:
   the corresponding feed-back latch (e.g., 622, 626, 628); and
   a corresponding n-type transistor (e.g., 624) having its gate connected to receive the corresponding decoded bit and having its channel connected between the first node and the corresponding feed-back latch.

7. The invention of claim 6, wherein each corresponding feed-back latch comprises:
   a first p-type transistor (e.g., 622) having its gate connected to receive the corresponding decoded bit and having its channel connected between the high reference voltage and a second node (W0) connected to the channel of the corresponding n-type transistor;
   an inverter (e.g., 626) connected between the second node and an output node (e.g., WL0) connected to the corresponding word-line; and
   a second p-type transistor (e.g., 628) having its gate connected to the output node and having its channel connected in parallel with the channel of the first p-type transistor between the high reference voltage and the second node.

8. The invention of claim 1, wherein, if a temporary noise glitch or decoded address overlap occurs in an unselected decoded bit in the second subset, then the corresponding feed-back latch inhibits the corresponding word-line from being energized.

9. The invention of claim 1, wherein the word-line driver is part of an address decoder implemented in the integrated circuit.

10. The invention of claim 9, wherein the address decoder is part of a memory device implemented in the integrated circuit.

11. The invention of claim 10, wherein the integrated circuit is an FPGA.

12. The invention of claim 1, wherein:
   the first set of circuitry comprises, for each decoded bit (e.g., D74) in the first subset:
      a p-type transistor (e.g., 606) having its gate connected to receive the corresponding decoded bit and its channel connected between a high reference voltage (e.g., VDD) and the first node; and
      an n-type transistor (e.g., 608) having its gate connected to receive the corresponding decoded bit and its channel connected between a low reference voltage (e.g., ground) and the first node;
   the first set of circuitry is shared by all of the word-lines in the set; and
   the second set of circuitry comprises, for each decoded bit (e.g., D0) in the second subset:
      the corresponding feed-back latch (e.g., 622, 626, 628); and
      a corresponding n-type transistor (e.g., 624) having its gate connected to receive the corresponding decoded bit and having its channel connected between the first node and the corresponding feed-back latch.

13. The invention of claim 12, wherein:
   the first subset of decoded bits comprises at least two decoded bits (e.g., D74, D118);
   the channels of the at least two p-type transistors (e.g., 602, 606) associated with the decoded bits in the first subset are connected in parallel between the high reference voltage and the first node;
   the channels of the at least two n-type transistors (e.g., 604, 608) associated with the decoded bits in the first subset are connected in series between the low reference voltage and the first node; and each corresponding feed-back latch comprises:
- a first p-type transistor (e.g., 622) having its gate connected to receive the corresponding decoded bit and having its channel connected between the high reference voltage and a second node (W0) connected to the channel of the corresponding n-type transistor;
- an inverter (e.g., 626) connected between the second node and an output node (e.g., WL0) connected to the corresponding word-line; and
- a second p-type transistor (e.g., 628) having its gate connected to the output node and having its channel connected in parallel with the channel of the first p-type transistor between the high reference voltage and the second node.

14. The invention of claim 13, wherein the first set of circuitry further comprises:
- another p-type transistor (e.g., 610) having its gate connected to receive a distinct enable signal (e.g., EN) and having its channel connected in parallel with the channels of the at least two p-type transistors; and
- another n-type transistor (e.g., 612) having its gate connected to receive the enable signal and having its channel connected in series with the channels of the at least two n-type transistors.

15. The invention of claim 13, wherein, if a temporary noise glitch or decoded address overlap occurs in an unselected decoded bit in the second subset, then the corresponding feed-back latch inhibits the corresponding word-line from being energized.

16. The invention of claim 13, wherein:
- the word-line driver is part of an address decoder implemented in the integrated circuit; and
- the address decoder is part of a memory device implemented in the integrated circuit.

17. An integrated circuit having an address decoder (100) comprising:
- one or more bit decoders (e.g., 102), each adapted to convert one or more address bits (e.g., A0, A1) into two or more decoded bits (e.g., DEC0–DEC3); and
- one or more word-line drivers (e.g., 104, 600), each adapted to receive a set of decoded bits (e.g., D0, D1, D74, D118) and control a set of word-lines (e.g., WL0, WL1), each word-line driver comprising:
  - a first set of circuitry (e.g., 602–608) adapted to receive and process a first subset of one or more decoded bits (e.g., D74, D118) and connected to a first node (e.g., W) in the word-line driver; and
  - a second set of circuitry (e.g., 614–628) connected to the first node and adapted to receive and process a second subset of decoded bits (e.g., D0, D1) to control the set of word-lines, wherein, for each word-line (e.g., WL0), the second set of circuitry comprises a corresponding feed-back latch (e.g., 622, 626, 628) controlled by a corresponding decoded bit (e.g., D0) and adapted to drive the corresponding word-line low if the corresponding decoded bit indicates that the corresponding word-line is not selected.

18. The invention of claim 17, wherein, if a temporary noise glitch or decoded address overlap occurs in an unselected decoded bit in the second subset, then the corresponding feed-back latch inhibits the corresponding word-line from being energized.

19. An integrated circuit having a memory device comprising:
- a block of memory cells arranged in rows; and
- an address decoder (e.g., 100) comprising:
  - one or more bit decoders (e.g., 102), each adapted to convert one or more address bits (e.g., A0, A1) into two or more decoded bits (e.g., DEC0–DEC3); and
  - one or more word-line drivers (e.g., 104, 600), each adapted to receive a set of decoded bits (e.g., D0, D1, D74, D118) and control a set of word-lines (e.g., WL0, WL1) for the block of memory cells, each word-line driver comprising:
    - a first set of circuitry (e.g., 602–608) adapted to receive and process a first subset of one or more decoded bits (e.g., D74, D118) and connected to a first node (e.g., W) in the word-line driver; and
    - a second set of circuitry (e.g., 614–628) connected to the first node and adapted to receive and process a second subset of decoded bits (e.g., D0, D1) to control the set of word-lines, wherein, for each word-line (e.g., WL0), the second set of circuitry comprises a corresponding feed-back latch (e.g., 622, 626, 628) controlled by a corresponding decoded bit (e.g., D0) and adapted to drive the corresponding word-line low if the corresponding decoded bit indicates that the corresponding word-line is not selected.

20. The invention of claim 19, wherein, if a temporary noise glitch or decoded address overlap occurs in an unselected decoded bit in the second subset, then the corresponding feed-back latch inhibits the corresponding word-line from being energized.

* * * * *